（12） United States Patent
Astigarraga et al.

(10) Patent No.: US 7,661,044 B2
(45) Date of Patent: Feb. 9, 2010

(54) METHOD, APPARATUS AND PROGRAM PRODUCT TO CONCURRENTLY DETECT, REPAIR, VERIFY AND ISOLATE MEMORY FAILURES

(75) Inventors: Tara Astigarraga, Tucson, AZ (US); William Edward Atherton, Hillsborough, NC (US); Michael Browne, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 11/673,630

(22) Filed: Feb. 12, 2007

(65) Prior Publication Data

US 2008/0195902 A1 Aug. 14, 2008

(51) Int. Cl.
G11C 29/00 (2006.01)
G06F 11/00 (2006.01)
H03M 13/00 (2006.01)

(52) U.S. Cl. .................. 714/723; 714/815; 714/31; 714/8; 714/719; 714/710

(58) Field of Classification Search .................. None
See application file for complete search history.

(56) References Cited

U.S. PATENT DOCUMENTS 4,736,373 A 4/1988 Schmidt
5,193,154 A * 3/1993 Kitajima et al. ............. 707/204
5,446,741 A 8/1995 Boldt et al.
5,590,087 A 12/1996 Chung et al.
5,706,234 A 1/1998 Pilch, Jr. et al.
5,928,367 A 7/1999 Nelson et al.
6,009,548 A 12/1999 Chen et al.
6,256,242 B1 7/2001 Dean
6,446,241 B1 9/2002 Mobley et al.
6,640,321 B1 * 10/2003 Huang et al. ................. 714/720
6,851,071 B2 2/2005 Bossen et al.
7,073,100 B2 * 7/2006 Chadwick et al. ........... 714/718

FOREIGN PATENT DOCUMENTS

JP 2003107134 A 4/2003

* cited by examiner

Primary Examiner—Christine T Tu
(74) Attorney, Agent, or Firm—Scully, Scott, Murphy & Presser, P.C.; John E. Campbell

(57) ABSTRACT

Method and system for repairing memory failure in a computer system in one aspect determines one or more test patterns and time duration for testing the new memory unit that replaced a failed memory unit. The test pattern is written to the new memory unit and read from the new memory unit. The read pattern is compared to the test pattern that was used to write. If the read test pattern and the written test pattern doe not match, a further repair action is taken. If they match, writing and reading of the test pattern repeats until the time duration for testing expires. The new memory unit may be configured as available for use when the write and read test completes successfully for the testing time duration.

13 Claims, 2 Drawing Sheets

METHOD, APPARATUS AND PROGRAM PRODUCT TO CONCURRENTLY DETECT, REPAIR, VERIFY AND ISOLATE MEMORY FAILURES

FIELD OF THE INVENTION

The present invention generally relates to computer memories and particularly to detecting and repairing memory failures.

BACKGROUND OF THE INVENTION

In high availability nonstop production environments concurrent recovery, repair and extensive testing of replacement memory such as DIMMS (dual in-line memory module) memory is highly desirable. Replacement memory DIMMs are prone to early life failures, contamination during shipment or installation. Improper installation processes often cause replacement DIMMs to fail. Replacement DIMMs frequently fail shortly after the memory is returned to the production use and under stress.

Conventional testing of replaced memory DIMMS typically involve background read only memory scrubbing techniques to clean up single bit errors and detect multiple bit errors in the system installation environment. Also in conventional testing methodologies that perform a write test, the entire productive system is disabled to accommodate the write test. These two methods and others like it either require a different system installation environment than the production environment or disruption of the production services or applications.

Accordingly, it is desirable to have a system and method that would allow a production system to have memory concurrently installed and stressed and verified in the actual production environment without affecting the production environment. This would allow the customer and the IT supplier to more confidently return repaired components after failure to production and verify replacement component.

SUMMARY OF THE INVENTION

A method and system for repairing memory failure in a computer system are provided. The method in one aspect comprises receiving a command that a failed memory unit has been replaced and to test the new memory unit in a memory subsystem having one or more memory units concurrently being used by a running processor, determining a test pattern, and determining a time duration for testing the new memory unit. The method further includes writing the test pattern to the new memory unit, reading the written test pattern from the new memory unit, and comparing the test pattern read with the test pattern that was written. If the read test pattern and the written test pattern do not match, the method may further include notifying that the new memory unit is bad and if the read test pattern and the written test pattern match, determining if the time duration for testing has expired. If the time duration has not expired, the method further may include repeating the steps of writing, reading, and comparing. If the time duration has expired, the method may further include configuring the new memory as being available for use.

A program storage device readable by machine, tangibly embodying a program of instructions executable by the machine to perform the above method steps for repairing memory failure in a computer system is also provided.

A system for recovering memory failure in a computer system, in one aspect may comprise a processor operable to receive a command that a failed memory unit has been replaced and to test the new memory unit in a memory subsystem of a computer system. The memory subsystem may have one or more memory units. The processor may be further operable to determine a test pattern and determine time duration for testing the new memory unit. The processor further may be operable to write the test pattern to the new memory unit, read the written test pattern from the new memory unit, and compare the test pattern read with the test pattern that was written. If the read test pattern and the written test pattern do not match, the processor may be operable to notify that the new memory unit is bad and if the read test pattern and the written test pattern match, the processor may be operable to further determine if the time duration for testing has expired. If the time duration has not expired, the processor may be operable to repeat the steps of writing, reading, and comparing, and if the time duration has expired, the processor may be operable to configure the new memory as being available for use.

Further features as well as the structure and operation of various embodiments are described in detail below with reference to the accompanying drawings. In the drawings, like reference numbers indicate identical or functionally similar elements.

DETAILED DESCRIPTION OF THE PREFERRED EMBODIMENTS

Figure 1:
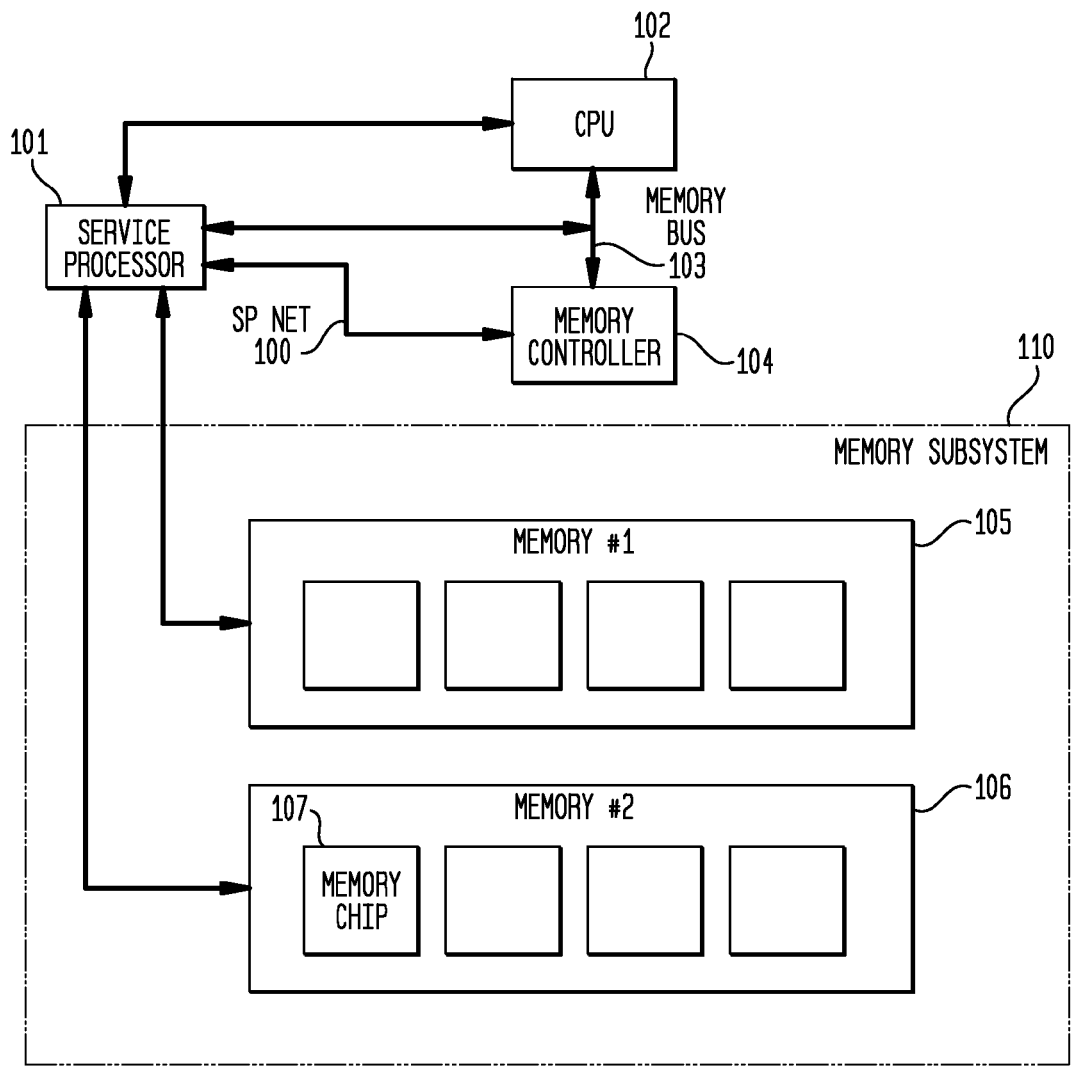
FIG. 1 is a block diagram of a computer with a single copy of real memory and multiple memory DIMMS.

FIG. 1 is a block diagram illustrating computer components and a single copy of real memory and multiple memory DIMMs. While the description in the present disclosure refers to DIMMs as examples of memory units, it should be understood that the system and method of the present disclosure applies to any other memory unit, known or will be known, and therefore, is not limited to DIMMs only. In one embodiment of the present invention, a part of a repair action, for instance, at the customer's or service technician's direction, performs write and read tests on memory DIMMS or a single DIMM before returning the replaced memory DIMM or DIMMs to operating system use. In FIG. 1, a computer system has a central processing unit (CPU) 102, Service Processor 101, Memory Bus 103, Service Processor writing net 100, Memory Controller 104, Memory Chip 107 on Memory DIMM 106. Memory DIMM 105 is another DIMM like the Memory DIMM 106. The I/O (input/output) portion of the computer has been omitted for clarity but is not excluded from the scope of the invention as existing in a typical computer. The CPU may run operating system such as AIX5L. A service processor 101 may also have its own operating system such as a Linux derivative. A service processor 101 has the ability to send commands, data and execute programs at a microcode level to all components of a computer. Each component may be wired to the service processor 101 on its own bus network. In other embodiments, a BIOS ROM and or RAM or the like may be used instead of a service processor. The functions disclosed in the present disclosure may be implemented in a service processor or BIOS or the like. A memory bus 103 usually exists between a CPU 102 or CPUs that connect to a memory controller 104 that in turn can individually communicate with each addressable area of the memory subsystem 110. In one embodiment, each memory chip on a DIMM contains storage and logic to perform memory operations and send and receive commands and data from the memory controller.

Figure 2:
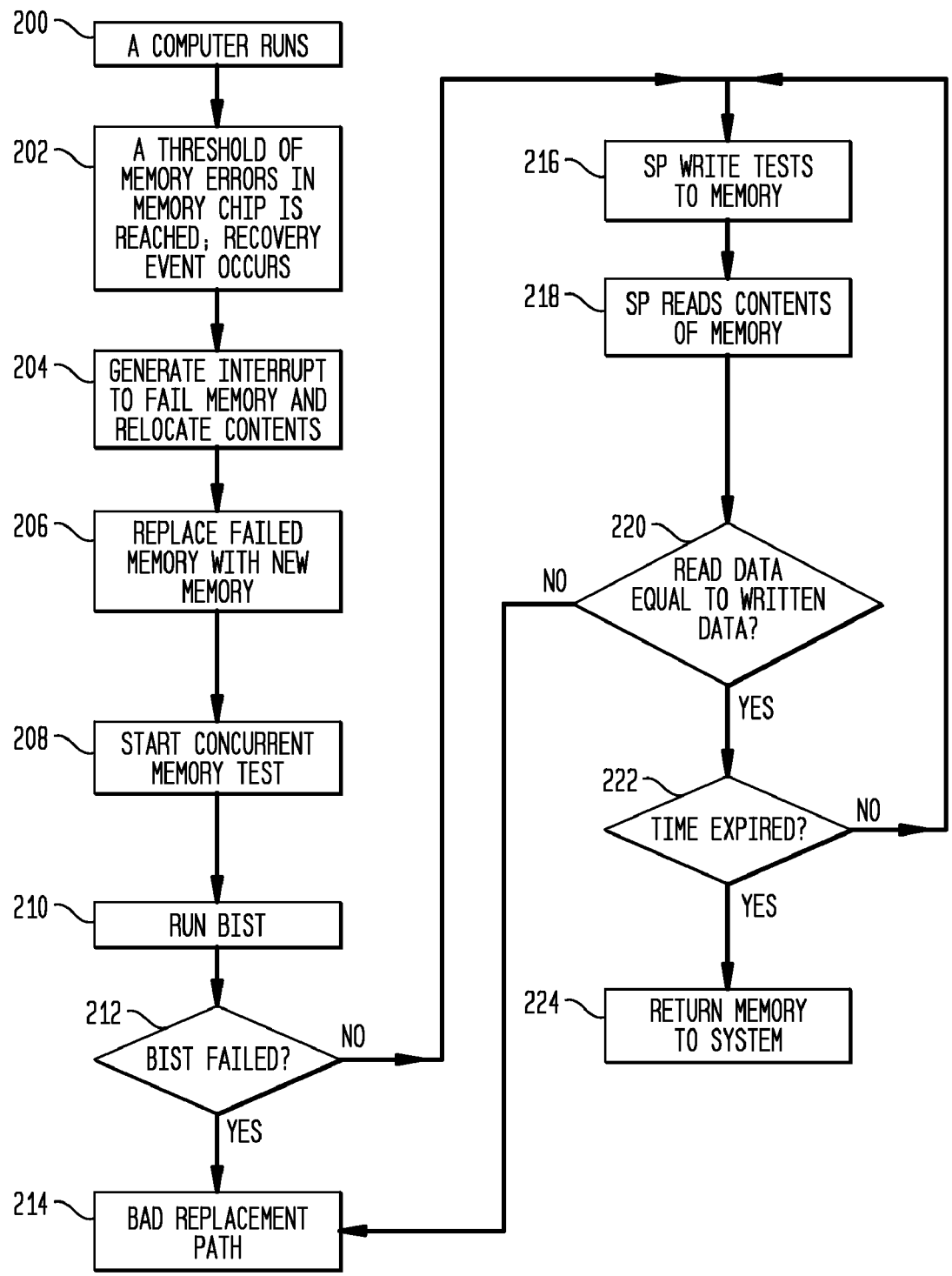
FIG. 2 illustrates a method flow of general events according to the present invention in one embodiment.

FIG. 2 is flow diagram illustrating method steps of the present invention in one embodiment. At step 200, a computer is running. The computer, for instance, may be a general purpose computer such as an IBM P-Series POWER5 server running AIX 5L operating system. The computer may be performing normal application processing and operating system functions such as I/O, virtual memory demand paging, network input and output to other computers or networks, etc.

In one embodiment, the memory subsystem has the ability to detect errors that are both recoverable and unrecoverable. Recoverable errors can be corrected with Error Correcting Codes, ECC. A counter in an implementation dependent location in the memory subsystem is kept of the number of recoverable errors in a particular memory chip. A threshold is met after and appropriate number of recoverable errors to force the proactive removal of the memory chip such as the Memory DIMM shown at 107 (FIG. 1). At step 202, a memory recovery event occurs when the threshold is reached or exceeded.

At step 204, the logic in DIMM (FIG. 1 106) creates an interrupt to the operating system via the memory controller 104 to relocate the contents of memory from memory chip (FIG. 1 107) to another DIMM such as the one shown at 105 in FIG. 1. This may cause the contents of a memory chip in DIMM 105 to be paged out to paging storage if, for example, real memory demands are such that there is not enough free real memory.

A service processor (FIG. 1 101) also receives this event and sends commands to the memory controller (FIG. 1 104) to create interrupts to the operating system to relocate the remaining contents of memory for the remaining memory chips on DIMM 106. In this example, the remaining contents may be stored to DIMM 105 or be paged out to paging storage. In another embodiment, with virtualized server partitions a hypervisor layer may be called to perform memory configuration options prior to sending commands to the operating system or memory controller. The hypervisor in these cases handles any address redirection and offsets from the real hardware addresses such that all servers virtualized partitions operating system all see real memory location 0000 as the first memory location.

A service processor (FIG. 1 101) configures DIMM (FIG. 1 106) as unavailable to the operating system so it is no longer used to place virtual memory or real memory pages. The service processor then powers off the DIMM slot for DIMM (FIG. 1 106). This enables the ability to hot remove and replace the memory DIMM in slot (FIG. 1 106).

At step 206, a service technician physically removes and replaces the failed DIMM (FIG. 1 106) with a new DIMM, which will be referred to as new DIMM or new memory from herein. For example, a service technician may request to power on the slot for the new DIMM and test the new memory unit. Such requests may be communicated using service processor interface command commonly available on a P-Series Hardware Management Console (HMC).

At step 210, the new DIMM has power applied to it and logic contained on that DIMM runs a Basic Initialization Self Test (BIST) to determine if there are any immediate failures. At step 212, if the BIST fails, the flow proceeds to the maintenance repair path at step 214 for a failed DIMM. Since this new DIMM was not under operating system control the running operating system is unaffected. If the BIST passes, at step 216, control of DIMM is returned back to the service processor 101, for example, via an interrupt being raised on the service processor wired net (FIG. 1 100). The service processor begins to write and read test this DIMM. A test pattern and length of test may be determined based on the request. For example, a test pattern may be determined or generated based on length and amount of memory being tested. An example of a test may be to use a test pattern for a period of time. For instance, the service processor may use test pattern 1 to 10 hours such that the test pattern is 4 Gigabytes (assuming a 4 GB DIMM) of repeating test data in the form of 0xF0F0F0F0F0F0F0F0 followed by 0xFFFFFFFFFFFFFFFF followed by 0x0000000000000001. A timer may be set for 10 hours and the test data is then written to DIMM 106.

At step 218, a service processor reads the contents of new DIMM that was test written. At step 220, the service processor compares to the read pattern to the known test pattern, that is, the test pattern that was used to write to the new memory at step 216. At 220, if the read pattern compares successfully to the written pattern, and the timer has not expired at 222, the testing continues by repeating steps 216 and 218 until the timer expires or the compare is not successful. It should be noted that recoverable errors could occur during this step and may not be detected by this test. The normal logic for chipkill for a recoverable error maybe used and this resulting flow would then be repeated. If the test at step 220 fails, maintenance repair action for a failed memory DIMM may be followed at step 214. Any known or will be known repair action for a failed memory DIMM may be followed. If the timer expired at step 222, the write and read tests have completed. A service processor may then configure the new DIMM as available for the system at step 224. This may or may not entail sending an initialization sequence to the memory DIMM depending on the architecture requirements. In other exemplary embodiments that have hardware memory mirroring the redundant DIMMS can be returned to use via hardware functionality.

A method, information processing system and computer readable medium allow for considerably extensive write and read testing of replaced memory DIMMS in a concurrent fashion. The write and read testing lengths and cycles can be set, for example, by an administrator or repair technician. This allows for "burn in" of the new memory DIMMS in their associated system installation environment.

The embodiments described above are illustrative examples and it should not be construed that the present invention is limited to these particular embodiments. Thus, various changes and modifications may be effective by one skilled in the art without departing from the spirit or scope of the invention as defined in the appended claims.

We claim:

1. A method for repairing memory failure in a computer system, comprising:
   receiving a command that a failed memory unit has been replaced and to test a new memory unit in a memory subsystem having one or more memory units concurrently being used by a running processor;
   determining a test pattern;
   determining time duration for testing the new memory unit;
   writing the test pattern to the new memory unit;
   reading the written test pattern from the new memory unit;
   comparing the test pattern read with the test pattern that was written, if the read test pattern and the written test pattern do not match, notifying that the new memory unit is bad and if the read test pattern and the written test pattern match, determining if the time duration for testing has expired;

if the time duration has not expired, repeating the steps of writing, reading, and comparing; and if the time duration has expired, configuring the new memory as being available for use.

2. The method of claim 1, further including:

detecting that the memory unit has failed in the memory subsystem;

relocating contents of the failed memory unit to one or more working memory units;

powering-off the failed memory unit for the failed memory unit to be replaced with a new memory unit, while allowing the running processor to continue to use the one or more working memory units.

3. The method of claim 2, wherein the step of detecting includes determining whether a threshold count for a number of recoverable errors occurring on the memory unit has exceeded.

4. The method of claim 1, wherein the test pattern is determined based on amount of memory in the new memory unit.

5. The method of claim 1, wherein a service processor performs the steps of writing, reading and comparing for testing the new memory unit while a central processing unit is performing normal operations of the computer system.

6. A system for recovering memory failure in a computer system, comprising:

a processor operable to receive a command that a failed memory unit has been replaced and to test the new memory unit in a memory subsystem of a computer system, the memory subsystem having one or more memory units, the processor further operable to determine a test pattern and determine time duration for testing the new memory unit, the processor further operable to write the test pattern to the new memory unit, read the written test pattern from the new memory unit, and compare the test pattern read with the test pattern that was written, if the read test pattern and the written test pattern do not match, the processor operable to notify that the new memory unit is bad and if the read test pattern and the written test pattern match, the processor operable to determine if the time duration for testing has expired, and if the time duration has not expired, the processor operable to repeat the steps of writing, reading, and comparing, and if the time duration has expired, the processor operable to configure the new memory as being available for use.

7. The system of claim 6, further including:

a memory controller in the memory subsystem, wherein one or more memory units in the memory subsystem generate an interrupt upon failure and the interrupt is communicated to the processor via the memory controller.

8. The system of claim 6, wherein the computer system includes a central processing unit operable to relocating contents of the failed memory unit to one or more working memory units.

9. A program storage device readable by a machine, tangibly embodying a program of instructions executable by the machine to perform a method for repairing memory failure in a computer system, comprising:

receiving a command that a failed memory unit has been replaced and to test a new memory unit in a memory subsystem having one or more memory units concurrently being used by a running processor;

determining a test pattern;

determining time duration for testing the new memory unit;

writing the test pattern to the new memory unit;

reading the written test pattern from the new memory unit;

comparing the test pattern read with the test pattern that was written, if the read test pattern and the written test pattern do not match, notifying that the new memory unit is bad and if the read test pattern and the written test pattern match, determining if the time duration for testing has expired;

if the time duration has not expired, repeating the steps of writing, reading, and comparing; and if the time duration has expired, configuring the new memory as being available for use.

10. The program storage device of claim 9, further including:

detecting that a memory unit has failed in the memory subsystem;

relocating contents of the failed memory unit to one or more working memory units;

powering-off the failed memory unit for the failed memory unit to be replaced with the new memory unit, while allowing the running processor to continue to use the one or more working memory units.

11. The program storage device of claim 10, wherein the step of detecting includes determining whether a threshold count for a number of recoverable errors occurring on the memory unit has exceeded.

12. The program storage device of claim 9, whether the test pattern is determined based on amount of memory in the new memory unit.

13. The program storage device of claim 9, wherein the machine includes a service processor to perform the steps of writing, reading and comparing the testing the new memory unit while a central processing unit is performing normal operations of the computer system.

* * * * *